US008141028B2

(12) United States Patent
Herzl et al.

(10) Patent No.: US 8,141,028 B2
(45) Date of Patent: Mar. 20, 2012

(54) STRUCTURE FOR IDENTIFYING AND IMPLEMENTING FLEXIBLE LOGIC BLOCK LOGIC FOR EASY ENGINEERING CHANGES

(75) Inventors: Robert D. Herzl, South Burlington, VT (US); Robert S. Horton, Colchester, VT (US); Kenneth A. Lauricella, Colchester, VT (US); David W. Milton, Underhill, VT (US); Clarence R. Ogilvie, Huntington, VT (US); Paul M. Schanely, Essex Junction, VT (US); Nitin Sharma, South Burlington, VT (US); Tad J. Wilder, South Hero, VT (US); Charles B. Winn, Colchester, VT (US)

(73) Assignee: International Business Machines Corporation, Armonk, NY (US)

(*) Notice: Subject to any disclaimer, the term of this patent is extended or adjusted under 35 U.S.C. 154(b) by 200 days.

(21) Appl. No.: 12/054,835

(22) Filed: Mar. 25, 2008

(65) Prior Publication Data

US 2009/0183134 A1 Jul. 16, 2009

Related U.S. Application Data

(63) Continuation-in-part of application No. 12/014,240, filed on Jan. 15, 2008.

(51) Int. Cl.
*G06F 15/04* (2006.01)
*G06F 17/50* (2006.01)
(52) U.S. Cl. ........ 716/139; 716/106; 716/107; 716/108; 716/113; 716/132
(58) Field of Classification Search ............ 716/1, 4, 716/5, 12, 17, 106, 107, 108, 112, 113, 132, 716/133, 139
See application file for complete search history.

(56) References Cited

U.S. PATENT DOCUMENTS

| | | | |
|---|---|---|---|
| 5,696,943 A * | 12/1997 | Lee | 716/4 |
| 6,134,705 A * | 10/2000 | Pedersen et al. | 716/18 |
| 6,255,845 B1 | 7/2001 | Wong et al. | |
| 6,404,226 B1 * | 6/2002 | Schadt | 326/41 |
| 6,453,454 B1 | 9/2002 | Lee et al. | |
| 6,993,738 B2 | 1/2006 | Brazell et al. | |
| 7,034,384 B2 | 4/2006 | Tsai | |
| 7,137,094 B2 | 11/2006 | Tien | |
| 7,171,641 B2 * | 1/2007 | Kurose et al. | 716/113 |
| 7,191,426 B1 | 3/2007 | Singh et al. | |
| 7,326,595 B2 * | 2/2008 | Kuroki | 438/128 |
| 7,805,701 B1 * | 9/2010 | Xin-LeBlanc | 716/55 |
| 2004/0080334 A1 * | 4/2004 | Vergnes | 326/10 |
| 2004/0199879 A1 * | 10/2004 | Bradfield et al. | 716/1 |
| 2005/0091627 A1 * | 4/2005 | Satapathy et al. | 716/12 |
| 2006/0193186 A1 * | 8/2006 | Sakihama et al. | 365/200 |

(Continued)

OTHER PUBLICATIONS

"5. Engineering Change Management", by Altera, @ Mar. 2007.*

(Continued)

*Primary Examiner* — Paul Dinh
*Assistant Examiner* — Nha Nguyen
(74) *Attorney, Agent, or Firm* — David Cane; Roberts Mlotkowski Safran & Cole, P.C.

(57) ABSTRACT

A design structure for identifying engineering changeable logic, and replacing the identified engineering changeable logic with flexible logic blocks (FLB). The design structure is embodied in a machine readable medium for designing, manufacturing, or testing an integrated circuit.

2 Claims, 7 Drawing Sheets

U.S. PATENT DOCUMENTS

2006/0225008 A1* 10/2006 Schleicher et al. ............... 716/3
2008/0244482 A1* 10/2008 Chang et al. ...................... 716/5

OTHER PUBLICATIONS

Non Final Office Action dated Jan. 22, 2010 in U.S. Appl. No. 12/014,240.

Altera Corporation, "5. Engineering Change Management", Mar. 2007, 10 pages.

Office Action dated Jul. 22, 2010 for corresponding U.S. Appl. No. 12/014,240.

Final Office Action dated Jan. 21, 2011 for corresponding U.S. Appl. No. 12/014,240.

* cited by examiner

US 8,141,028 B2

STRUCTURE FOR IDENTIFYING AND IMPLEMENTING FLEXIBLE LOGIC BLOCK LOGIC FOR EASY ENGINEERING CHANGES

CROSS REFERENCE TO RELATED APPLICATIONS

The present application is a continuation-in-part of application Ser. No. 12/014,240, filed on Jan. 15, 2008, the contents of which are incorporated by reference in their entirety herein.

FIELD OF THE INVENTION

The present invention is related to a design structure, and more particularly, to a design structure for forming an application specific integrated circuit (ASIC), in particular, in response to engineering changes.

BACKGROUND OF THE INVENTION

An application specific integrated circuit (ASIC) is an integrated circuit designed or customized for a specific use or task. Generally, a customer or client requests a manufacturer or ASIC design center to fabricate an ASIC to perform specific logic. The customer may provide a "netlist," which represents the desired logic operation for the application, or some other representation of the logic for performing the desired task to a designer or engineer. The designer or engineer takes the customer's logic and synthesizes it into gate logic. This gate logic is then placed and routed to form a physical design of the chip, which can take, e.g., many weeks to months to complete.

During the placing and routing procedure, it is not unusual for the customer to request engineering changes for the logic, e.g., in an effort to improve the ASIC functionality. In this regard, it can be difficult, after logic synthesis and the initial physical design process, to change the placed and routed gate logic. As a result, incorporating the engineering changes into the ASIC may generally result in a very complicated and lengthy ordeal for the designer/engineer. Moreover, gate logic cannot generally simply be replaced, since changing gate logic can result in different timing characteristics between the gates that must also be considered in the new gate logic.

The underlying obstacles to putting in engineering changes to a chip have for a long time plagued designers. From distilling down the minimal change in a netlist (when the change was made to register transfer logic (RTL)) to rewiring gates on an existing placement the change is always a timely complicated process and does not lend itself to automation.

Functional logic blocks (FLBs) can be used in place of standard cell logic gates in order to enable easy changes to functional blocks with wire, as discussed in commonly owned U.S. application Ser. No. 11/838,929 filed Aug. 15, 2007, the disclosure of which is expressly incorporated by reference herein in its entirety. The function can be implemented with a separate library of simple logic, e.g., NAND gates and NOR gates, where the simple logic blocks are built up from higher complexity block, e.g., AOIs with inputs tied up and down inside the library block to create the simpler logic function. This would enable additional logic that can be easily changed in the existing logic path.

SUMMARY OF THE INVENTION

According to an aspect of the invention, a design structure embodied in a machine readable medium for designing, manufacturing, or testing an integrated circuit is provided. The design structure comprises a device for identifying engineering changeable logic, and a replacing device for replacing the identified engineering changeable logic with flexible logic blocks (FLB).

In embodiments, the design structure comprises a netlist. The design structure resides on storage medium as a data format used for the exchange of layout data of integrated circuits. The resides in a programmable gate array.

BRIEF DESCRIPTION OF THE DRAWINGS

The present invention is described in the detailed description which follows, in reference to the noted plurality of drawings by way of non-limiting examples of exemplary embodiments of the present invention.

DETAILED DESCRIPTION OF THE EMBODIMENTS OF THE INVENTION

The cost of using FLBs in place of simple logic can be quite expensive. Accordingly, the invention is directed to a design structure of identifying logic to be implemented in flexible logic blocks (FLBs) and a design structure for forming a chip, e.g., an application specific integrated circuit (ASIC). Further, while starting logic can be from a variety of sources, e.g., RTL for the chip, third party vendor provided RTL or netlists, FLBs can be used with all sources according to the invention.

Figure 1:
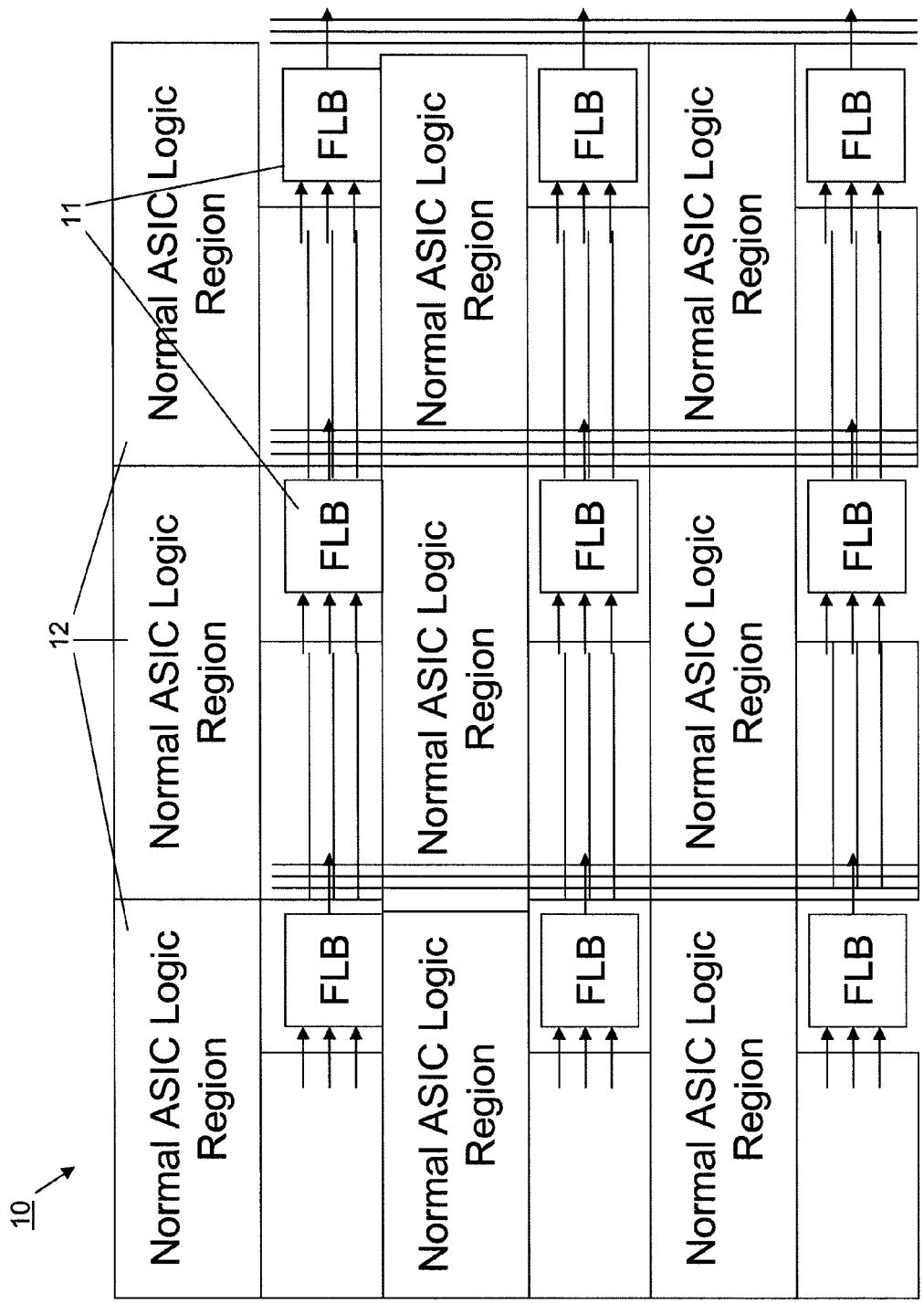
FIG. 1 illustrates an exemplary physical structure for an application specific integrated circuit (ASIC) chip according to an embodiment of the invention.

FIG. 1 illustrates the physical structure of an application specific integrated circuit (ASIC) structure according to the invention. As shown, flexible logic blocks (FLBs) 11 can be distributed or sprinkled across chip 10 with normal ASIC logic 12, e.g., in a regular array or predefined pattern. FLBs 11 and normal (standard) ASIC logic 12 can be interconnected (not shown) on chip 10 in order to perform the desired logic of the ASIC. Alternatively, regions of the chip 10 can be identified for utilizing FLBs 11 to be interconnected with normal ASIC logic 12 in such regions and throughout chip 10 to perform the desired ASIC functionality.

FLBs are enhanced logic function gates with at least one additional function wired to be initially deactivated, e.g., through extra tied inputs tied to ground. Thus, regions of the chip can be identified in order to arrange FLBs 11 across chip 10 or in the identified region of chip 10 to be interconnected with the normal ASIC logic and yet allow for easy changes to their function and operation. Further, to facilitate the late changes to the design, e.g., after the chip 10 has been placed and routed, these regions likely to require late changes can be identified in order to replace the standard logic with FLBs 11 having used and unused logic gates. Because of the unused or deactivated functions associated with the FLBs, the use of FLBs 11 allow for engineering changes to the ASIC logic, even if not made until late in the design cycle. Moreover, the engineering changes can be effected through wire only changes, thereby avoiding timing problems generally associated with replacing and/or adding logic gates to the chip.

The use of FLBs 11 and their associated reconnection techniques to utilize initially unused logic allow changes to be easily made to FLB function even after the chip is manufactured. Wiring to and from FLBs 11 can stretch around chip 10 or the predefined region of chip 10 to enable easy connections to and from other standard ASIC function placed and wired on chip 10. Further, for ease of modifying the logic, it may be advantageous to build much of the original logic function on chip 10 from FLBs 11.

ASIC chips are generally requested by a customer who provides a "netlist" representing the desired logic for the application to be performed. The manufacturer of the chip can synthesize gate logic from the customer netlist, which can be formed in, e.g., register transfer logic (RTL). As the cost for FLBs can be greater than the cost for the simple logic it replaces, it can be advantageous to identify the logic likely to be subject to subsequent engineering changes.

Moreover, FLBs can also be synthesized, placed and routed in place of normal ASIC gates in areas of the chip identifiable as engineering changeable, e.g., in which new functions, changed functions, new hardware, or bug fixes have been made. In this event, such FLB gates may have some of inputs and outputs wired to perform the functioning logic of the normal ASIC gate and have additional inputs, and perhaps even outputs, that are at least initially appropriately tied off so the FLB functions as the normal ASIC gate it replaces. With this design, should a change, e.g., an engineering change, be required or requested by the customer or designer later in the design cycle, e.g., after placing and routing, the FLB can replace the standard logic so the function of the FLB can be easily changed or effected through wire only changes to the inputs and/or outputs of the FLB.

Figure 2:
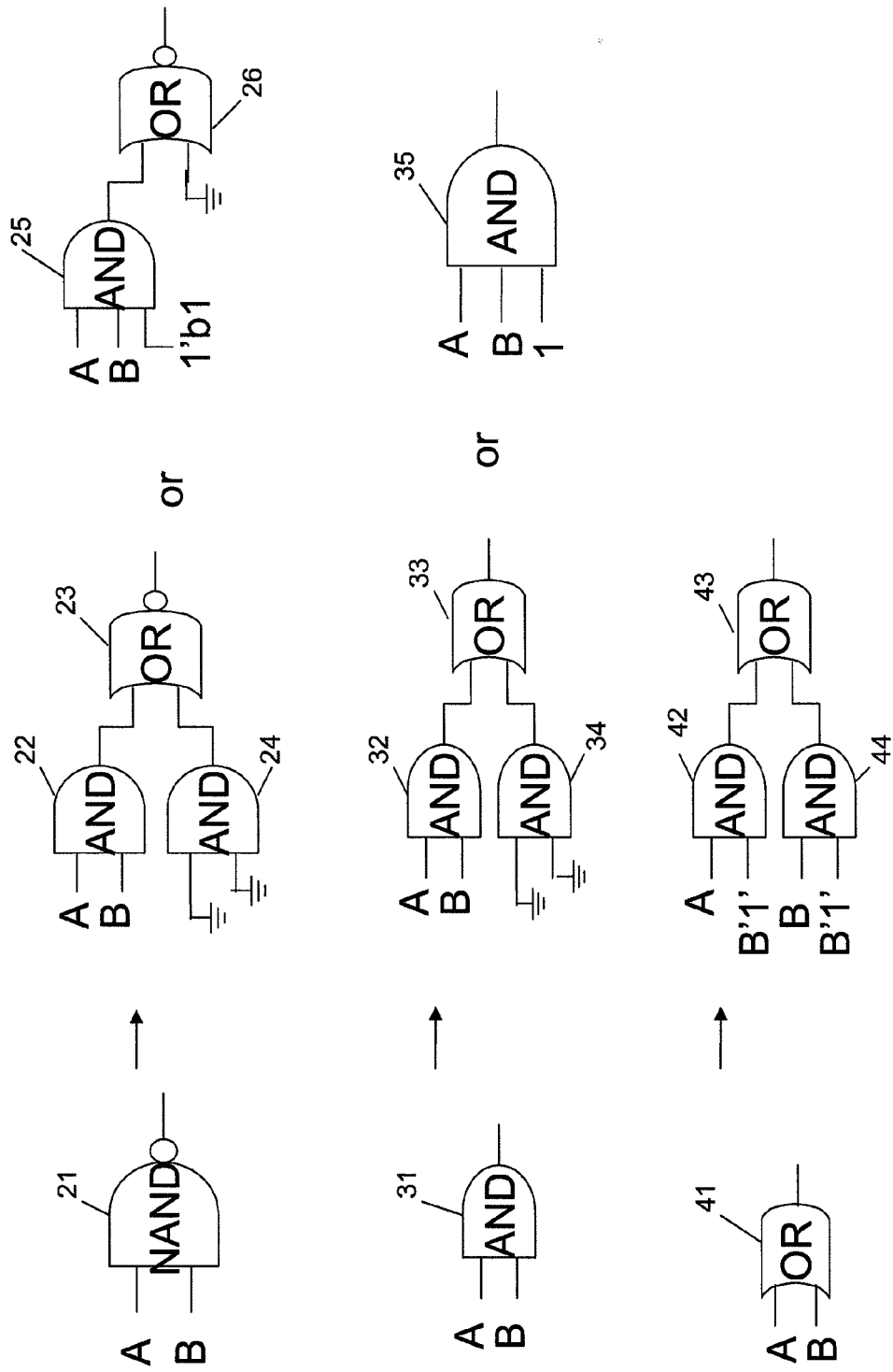
FIG. 2 illustrates examples of normal ASIC gates and suitable replacement flexible logic blocks (FLBs) in accordance with the invention.

After a piece of logic or a specific area of the chip has been identified, the specific gates of this identified logic (risky or normal) or area can be isolated and synthesized or formed with FLBs or combinations of FLBs and normal logic gates. As noted above, while FLBs can be very complex functions, e.g., programmable MUX structures, NAND and NOR gates with and/or inverted gates (AOIs) with appropriately tied off inputs, they can change their function through a mere change of wiring. Moreover, it may be advantageous to arrange the tied inputs on metal layers where they can be accessed and, therefore, easily changed. FIG. 2 illustrates examples of normal ASIC gates and suitable replacement FLBs that can be used in place them.

By way of non-limiting example, FIG. 2 illustrates a normal or standard logic block and a suitable replacement FLB at least initially wired to function as the normal logic block it can replace. According to an aspect of the invention, a standard NAND gate 21 having inputs A and B can be replaced with an FLB formed of an AND gate 22 with inputs A and B and an output coupled to an OR inverted gate 23. Another AND gate 24 has inputs tied to ground and an output coupled to the OR inverted gate 23. Also, NAND gate 21 can be formed as an AND-OR inverted (AOI) in which AND gate 25 has inputs A and B and 1'b1 and an output coupled to OR inverted gate 26. The other input to OR inverted gate 26 is tied to ground. According to another aspect of the invention, a standard AND gate 31 having inputs A and B can be replaced with an FLB formed of an AND gate 32 with inputs A and B and an output coupled to an OR gate 33. Another AND gate 34 has inputs tied to ground and an output coupled to the OR gate 33. Also, AND gate 31 can be formed as by AND gate 35 having inputs A and B and 1. Moreover, standard OR gate 41 having inputs A and B can be replaced with an AND gate 42 with inputs A and B'1' and an output coupled to an OR gate 43. Another AND gate 44 has inputs B and B'1' and an output coupled to the OR gate 43. It is understood that additional and even more complicated FLBs can be formed for replacing standard logic blocks without departing from the spirit and scope of the invention. Further, while FIG. 2 illustrates exemplary basic standard logic block, it is understood other FLBs can be designed and initially wired for replacing other standard logic blocks that have not been illustrated here without departing from the scope and spirit of the invention.

As shown in the illustrations of the replacement FLB in FIG. 2, the inputs and outputs of the FLBs are initially wired not only to perform the functioning logic of the normal ASIC gate it replaces but also to include additional inputs, and perhaps even outputs, that are appropriately tied off, e.g., to ground. As discussed above, this design allows for easy alteration of the functioning of the FLBs through the wiring of the gates. Should a change, e.g., an engineering change, be required later in the design cycle, e.g., after placing and routing, the function of the FLB or the inputs and/or outputs of the FLB can be easily added to or changed with wire only changes.

During design and implementation of a chip, FLBs can be used, e.g., to fix late-found bugs. Further, logic identifiable as highly probable for engineering changes or for replacement with FLBs can be tagged by, e.g., identifying synthesis directives in the source code (RTL); identifying hierarchy in design (named block, unit instance name); start and/or endpoint cones of logic; identifying dataflow and tagging non-dataflow; and tracking changes using logical equivalency checking between a chip netlist and a previous version of that netlist. Cones of logic changed are new function/bug fixes and therefore high-risk engineering change areas.

Figure 3:
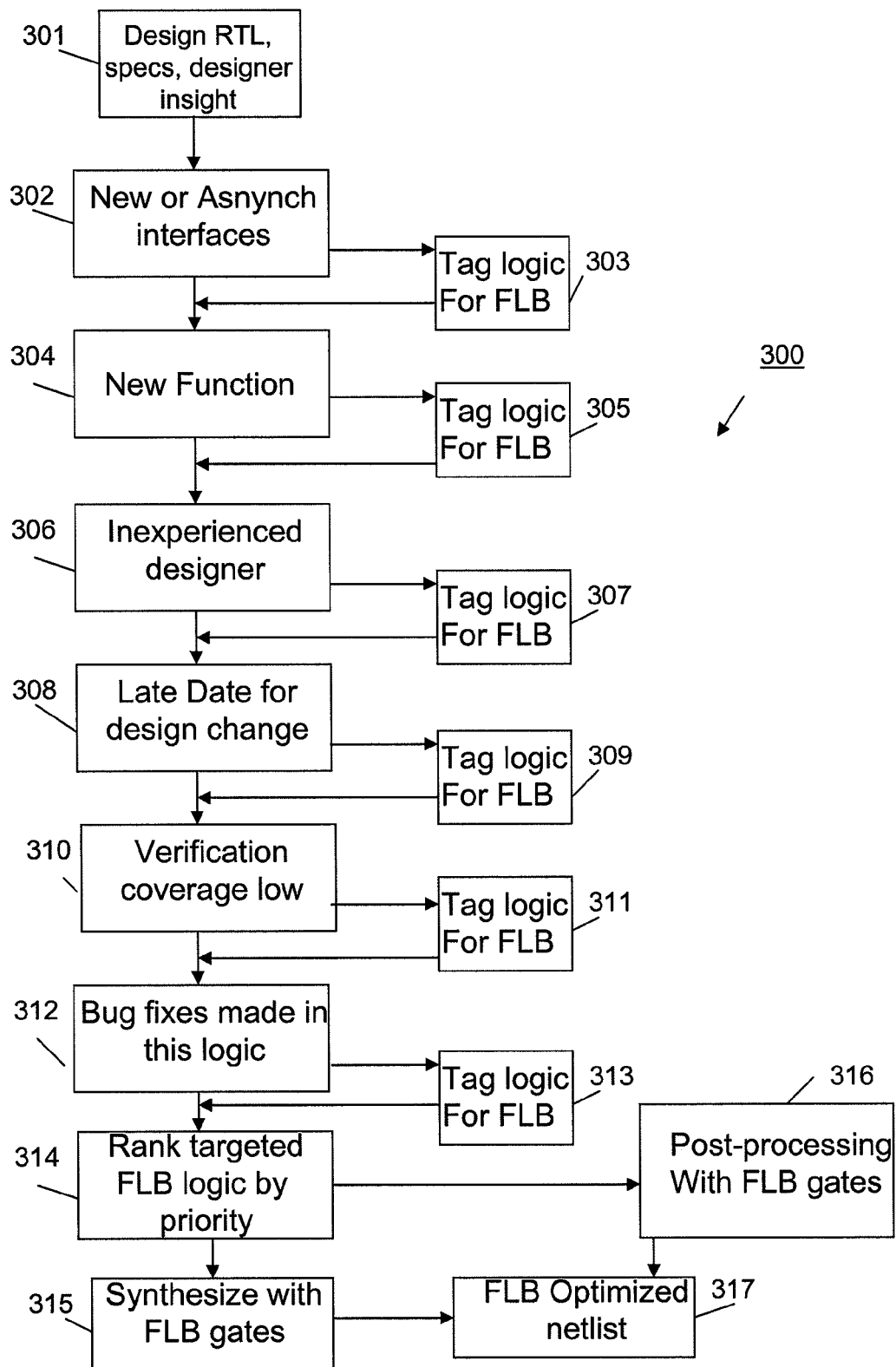
FIG. 3 illustrates an exemplary flow diagram for performing an embodiment of the invention.

FIG. 3 shows a flow diagram 300 for an FLB RTL substitution flow according to the invention. The initial RTL logic can be created from a customer's desired logic for the chip application or netlist. From the design RTL, the application specifications, designer's insight, and units and/or subunits of the logic can be analyzed at step 301. At step 302, a determination is made whether the logic is at least one of a new or asynchronous interface. If yes, the logic can be tagged or flagged for implementation as an FLB at step 303.

The tag function can be implemented through a synthesis tool or a post-processing tool. Thus, the logic can be tagged in the source code (RTL) with a direct synthesis tool to implement logic with FLBs until instructed otherwise, or the logic can also be tagged with a synthesis script, e.g., as a table in a post processing tool to replace logic with FLB books.

If no, a determination is made at step 304 whether the logic relates to a new function. In this regard, if the function has not been used before, it may be prone to error and, therefore, necessitate subsequent engineering changes. If a new function, the logic is tagged or flagged for implementation as an FLB at step 305. If not a new function, a determination is made at step 306 whether the designer is inexperienced, because inexperienced designers may be more likely than experienced designers to have mistakes in their logic. Therefore, if designed by an inexperienced designer, the logic can be tagged or flagged for implementation as an FLB at step 307, otherwise a determination is made at step 308 whether it is a late date for design change. This can be significant since the logic may not have been tested or not fully tested. If a late date for design change is identified, the logic can be tagged or flagged for implementation as an FLB at step 309. If not, a determination can be made at step 310 if verification coverage is low, as this can be difficult to test. If verification coverage is low, the logic can be tagged or flagged for implementation as an FLB at step 311. Otherwise, a determination is made at step 312 if bug fixes have been made in this logic. If such fixes have been made, the logic may be tagged or flagged to be implemented as an FLB at step 313. Thereafter, the tagged or flagged FLBs can be ranked according to a priority assignment at step 314.

A priority tag related to a relative importance of the tagged engineering changeable parameter can be utilized to identify which logic is more desirable to target for FLB implementation. Priority can be assigned to various methods for identifying where to use FLBs, e.g., priority may be inversely proportional to verification coverage, since logic areas with low verification coverage are more likely to require engineering changes; designer or verifier experience; interface regions, e.g., asynchronous, between major blocks, between new functions, etc.; dates and days of development and verification; history of the logic function, e.g., range of new function to previously used on other chips; and feedback from logic bug reports, which can be mapped across the entire logic. In the process of designing a chip, simulation typically progresses with the bug fix rate decreasing exponentially. If a log, kept for all bugs encountered and fixed, is mapped over the logic, it could be used as an indicator of entities needing implementation in FLBs and as an indicator of future bug likelihood.

The FLB gates can be synthesized where tagged or flagged and meeting constraints at step 315 or can be synthesized using normal library at step 316 to post process the FLB gates where tagged or flagged and meeting constraints. If the amount of logic targeted for replacement with FLBs exceeds chip area/power/timing constraints, it may be advantageous to back-off replacement of changeable logic with FLBs. However, synthesis would use these priority tags to make appropriate trade-off between area/power/timing and engineering changeability. Thereafter, the FLB netlist is optimized at step 317.

In step 315, the tags/flags can be put on the logic structures in the form of synthesis directives or synthesis script in comments in the RTL source code to synthesize the tagged blocks with FLB gate libraries as the target block, i.e., FLB targeted logic can be isolated into separate logic files, and synthesized using minimal blocks like NANDs and NORs. Further, the synthesis tool can be used to target a source or sink of cones by flop names identified by the logic designer to target the FLB gate library as the target library. With regard to cones, the start of a cone can be a point in the logic where the signal fans out, and the endpoints of the cone can be an output signal or latch. More particularly, inputs that can be cause an output to change can funnel down to a single point or expand from a single point.

In step 316, tagged blocks can be post-processed as FLB gate libraries. FLB targeted logic can be synthesized using minimal logic blocks, such as AOIs or muxes, with additional tied input lines. Alternatively, a targeted block can be synthesized with an FLB gate library as the target library, which allows changes in wire only. Further, the post-processing tool can be used to target flops/POs/PIs as a source or sink of cones of logic to replace simple NAND/NOR logic with FLB gates.

Moreover, according to a further aspect of the invention, data flow, e.g., adders, multiplexers, etc., can be identified, whereby non-data flow (control logic) can be targeted for FLB logic. As control logic is not typically easily identified, the method according to this aspect of the invention can identify data flow, e.g., from a netlist, and all unidentified logic can be considered as changeable logic.

Figure 4:
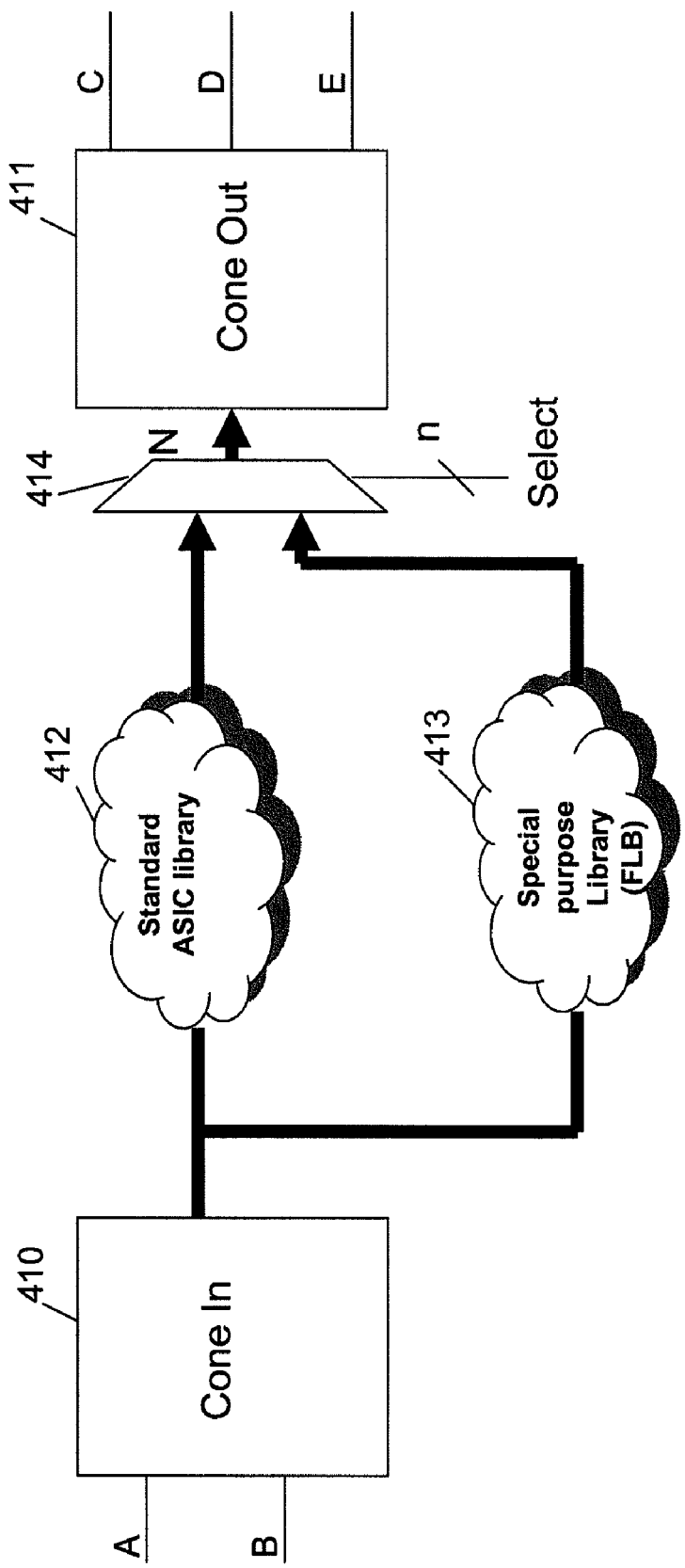
FIG. 4 illustrates an exemplary flow diagram for changing cones of logic to FLBs and/or providing redundant FLBs for identified cones.

Further, FIG. 4 illustrates a flow diagram for changing cones of logic to FLBs and/or providing redundant FLBs for identified cones of logic. According to an implementation of the inventive method, cones of logic that may require engineering changes can be formed of standard cell gates to be replaced by FLB gates. This may allow logic changes to be made only by changing wires. Moreover, some engineering changes may require that the original function of the logic remain intact for some logic cones while others require the change. Thus, the flow diagram of FIG. 4 can be used when a logic change is needed to fix a bug, but downstream logic may need the function of the logic to be unchanged. By way of non-limiting example, cone in element 410 can be coupled to a cone out element 411 through a parallel arrangement of a standard ASIC library 412 and a special purpose library 413 connected to a selector 414. Selector 414 can be any known selector device, e.g., a multiplexer, arranged to select one or both of the libraries, whereby an FLB can be selected to replace the standard ASIC logic or an FLB can be selected to be arranged in parallel with the standard ASIC logic to provide redundant logic between cone in element 410 and cone out element 411. In an example of the illustrated embodiment, cone in element 410 can include inputs A and B and cone out element 411 can include outputs C, D, and E. If it is determined that to fix a bug in the logic output D needs an input F (not shown), the selector can select a redundant FLB with input F, while outputs C and E remain unchanged with inputs A and B.

Figure 5:
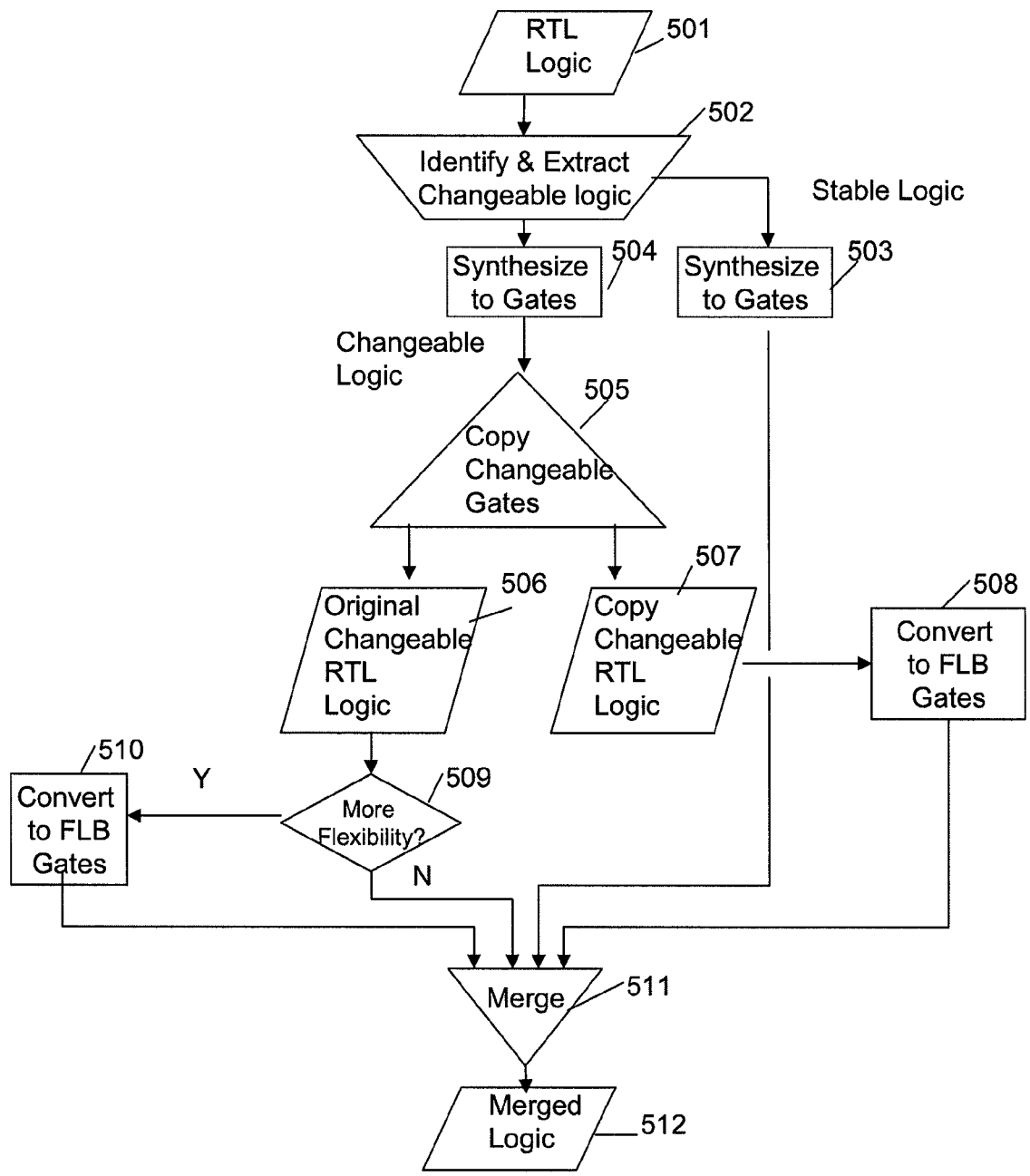
FIG. 5 illustrates a non-limiting exemplary flow diagram of operation of the illustration depicted in FIG. 4.

FIG. 5 illustrates a non-limiting exemplary flow diagram of operation of the illustration depicted in FIG. 4. As shown, the RTL logic is implemented in step 501. At step 502, the engineering changeable logic is identified and extracted, e.g., via synthesis directives or synthesis script. At step 503, the stable or non-changeable logic is synthesized to gates, while changeable logic is synthesized to gates at step 504. The changeable logic is copied at step 505 to produce original changeable RTL logic at step 506 and a copy of the changeable RTL logic at step 507. The copy of the changeable RTL logic, which is redundant with respect to the original changeable RTL logic, can be converted into FLB gates at step 508. At step 509, a determination is made whether more flexibility is needed in the original changeable RTL logic. If more flexibility is needed, the original changeable RTL logic can be converted to FLB gates at step 510, otherwise, no further action on the original changeable RTL logic is necessary. The gate logic from steps 503, 508 and 509/510 can be merged, e.g., with a multiplexer or other selection device, at step 511 into merged logic at step 512.

Figure 6:
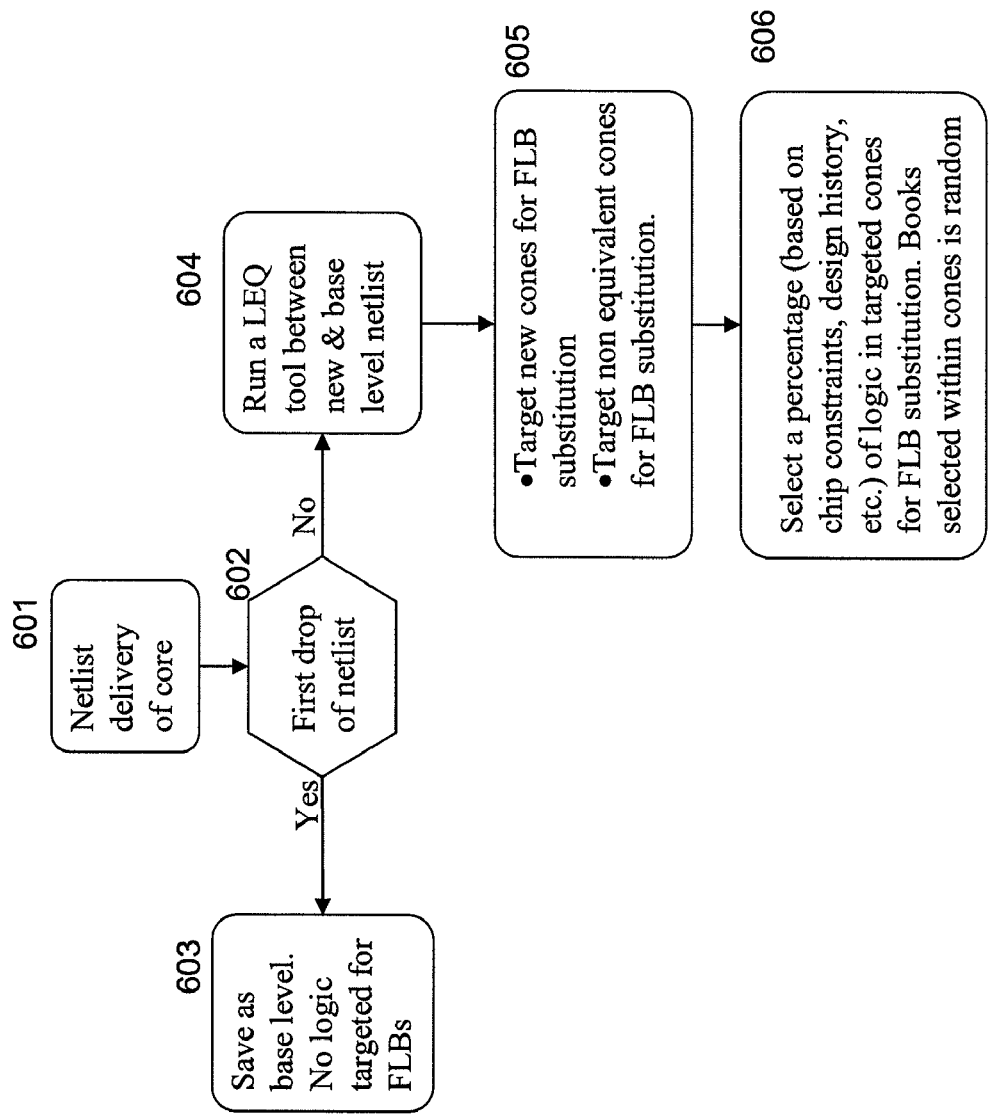
FIG. 6 illustrates an exemplary flow diagram of a netlist comparison method.

According to still another aspect of the invention, a non-limiting example of a netlist comparison method is depicted in FIG. 6, in which a post-synthesis replacement of standard cell logic in the netlist with FLB logic is based on logic cones that are no longer equivalent to a previous netlist. Thus, FIG. 6 depicts a flow diagram to identify high risk parts of a netlist to be implemented with FLBs, yet does not require RTL source code, but can be implemented through netlists provided to the ASIC vendor. At step 601, a netlist is delivered to the ASIC vendor by the customer, and a determination is made at step 602 whether the delivered netlist is the first drop of the netlist. If the first drop, the netlist is saved as a base level at step 603 and no logic is targeted for FLBs. As successive netlists are delivered to the ASIC vendor from the customer, the ASIC vendor can compare the netlists to identify where the customer is making bug fixes or to identify new functions. By way of example, a subsequent netlist release can include most of the customer's design being submitted for a first analysis of what the chip may look like. Another subsequent netlist release can include a final output of synthesis in order to analyze timing and/or performance of the chip. Still another subsequent netlist release can be the last netlist received from the customer.

When the delivered netlist is not the first drop, a logical equivalency testing (LEQ) tool is run at step 604 between the new netlist and the saved base level netlist in order to identify new function, changed functions, bug fixes, etc. At step 605, new cones for FLB substitution can be targeted, e.g., new function or part of a fix, and non-equivalent cones for FLB substitution can be targeted, e.g., new design (which may or may not be proven logic). A percentage of logic (based on chip constraints, design history, etc.) can be selected in the targeted cones for FLB substitution at step 606.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed. Moreover, the process as described above is used in the fabrication of integrated circuit chips.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Design Structure

Figure 7:
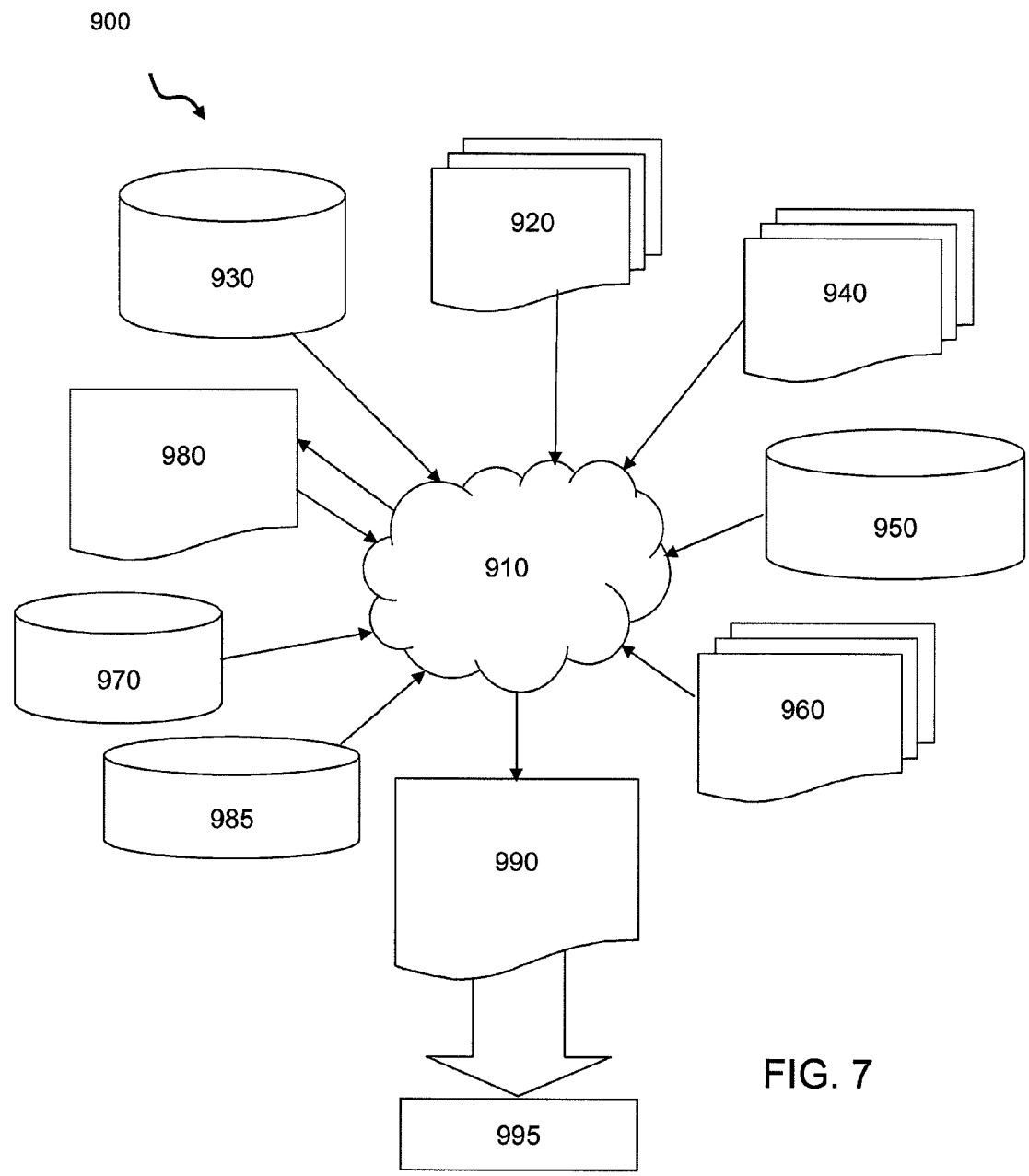
FIG. 7 is a flow diagram of a design process used in semiconductor design, manufacture, and/or test.

FIG. 7 shows a block diagram of an exemplary design flow 900 used for example, in semiconductor design, manufacturing, and/or test. Design flow 900 may vary depending on the type of IC being designed. For example, a design flow 900 for building an application specific IC (ASIC) may differ from a design flow 900 for designing a standard component or from a design from 900 for instantiating the design into a programmable array, for example a programmable gate array (PGA) or a field programmable gate array (FPGA) offered by Altera® Inc. or Xilinx® Inc. Design structure 920 is preferably an input to a design process 910 and may come from an IP provider, a core developer, or other design company or may be generated by the operator of the design flow, or from other sources. Design structure 920 comprises an embodiment of the invention as shown in, for example, FIGS. 1 and 2 in the form of schematics or HDL, a hardware-description language (e.g., Verilog, VHDL, C, etc.). Design structure 920 may be contained on one or more machine readable medium. For example, design structure 920 may be a text file or a graphical representation of an embodiment of the invention as shown in, for example, FIGS. 1 and 2. Design process 910 preferably synthesizes (or translates) an embodiment of the invention as shown in, for example, FIGS. 1 and 2 into a netlist 980, where netlist 980 is, for example, a list of wires, transistors, logic gates, control circuits, I/O, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which netlist 980 is resynthesized one or more times depending on design specifications and parameters for the circuit.

Design process 910 may include using a variety of inputs; for example, inputs from library elements 930 which may house a set of commonly used elements, circuits, and devices, including models, layouts, and symbolic representations, for a given manufacturing technology (e.g., different technology nodes, 32 nm, 45 nm, 90 nm, etc.), design specifications 940, characterization data 950, verification data 960, design rules 970, and test data files 985 (which may include test patterns and other testing information). Design process 910 may further include, for example, standard circuit design processes such as timing analysis, verification, design rule checking, place and route operations, etc. One of ordinary skill in the art of integrated circuit design can appreciate the extent of possible electronic design automation tools and applications used in design process 910 without deviating from the scope and spirit of the invention. The design structure of the invention is not limited to any specific design flow.

Design process 910 preferably translates an embodiment of the invention as shown in, for example, FIGS. 1 and 2, along with any additional integrated circuit design or data (if applicable), into a second design structure 990. Design structure 990 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 990 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce an embodiment of the invention as shown in, for example, FIGS. 1 and 2. Design structure 990 may then proceed to a stage 995 where, for example, design structure 990: proceeds to tape-out, is released to manufacturing, is released to a mask house, is sent to another design house, is sent back to the customer, etc.

While the invention has been described in terms of a preferred embodiment, those skilled in the art will recognize that the invention can be practiced with modifications within the spirit and scope of the appended claims.

What is claimed is:

1. A design structure embodied in a format readable by a machine, stored on a machine readable storage device for designing, manufacturing, or testing an integrated circuit, the design structure, when executed by the machine providing elements of the integrated circuit comprising:

a device for identifying engineering changeable logic;

a replacing device for replacing the identified engineering changeable logic with at least one flexible logic block (FLB) initially wired to perform a functioning logic equivalent to a functioning logic of a normal application specific integrated circuit (ASIC) gate the FLB replaces and which comprises additional inputs and outputs for changes of the functioning logic of the FLB, the replacing being based on a priority tag;

a cone in element comprising at least one input;

a standard ASIC library directly coupled to an output of the cone in element;

a special purpose FLB library directly coupled to the output of the cone in element;

a selector device directly coupled to an output of the standard ASIC library and an output of the special purpose FLB library, and for selecting at least one of the output of the standard ASIC library and the output of the special purpose FLB library;

a cone out element directly coupled to an output of the selector device, and comprising at least one output; and wherein the additional inputs and outputs of the FLB are initially tied off so that the functioning logic of the FLB is equivalent to the functioning logic of the normal ASIC gate the FLB replaces; and the changes of the functioning logic of the FLB comprises wire only changes to the additional inputs and outputs of the FLB.

2. An integrated circuit chip, comprising:

a device for identifying engineering changeable logic;

a replacing device for replacing the identified engineering changeable logic with at least one flexible logic block (FLB) initially wired to perform a functioning logic equivalent to a functioning logic of a normal application specific integrated circuit (ASIC) gate the FLB replaces and which comprises additional inputs and outputs for changes of the functioning logic of the FLB, the replacing being based on a priority tag, wherein the device for identifying engineering changeable logic comprises a device to tag logic related to at least one of: inexperienced designer; late date design changes; low verification coverage; and bug fixes made to the logic;

a cone in element comprising at least one input;

a standard ASIC library directly coupled to an output of the cone in element;

a special purpose FLB library directly coupled to the output of the cone in element;

a selector device directly coupled to an output of the standard ASIC library and an output of the special purpose FLB library, and for selecting at least one of the output of the standard ASIC library and the output of the special purpose FLB library; and a cone out element directly coupled to an output of the selector device, and comprising at least one output; and wherein the additional inputs and outputs of the FLB are initially tied off so that the functioning logic of the FLB is equivalent to the functioning logic of the normal ASIC gate the FLB replaces; and the changes of the functioning logic of the FLB comprises wire only changes to the additional inputs and outputs of the FLB.

* * * * *